United States Patent [19]
Wimberger Friedl et al.

[11] Patent Number: 5,997,800
[45] Date of Patent: Dec. 7, 1999

[54] METHOD OF MANUFACTURING A MULTILAYER ELECTRONIC COMPONENT

[75] Inventors: Reinhold Wimberger Friedl; Peter P. Koets; Johan G. De Bruin, all of Eindhoven, Netherlands

[73] Assignee: U.S. Philips Corporation, New York, N.Y.

[21] Appl. No.: 09/179,165

[22] Filed: Oct. 26, 1998

[30] Foreign Application Priority Data

Oct. 29, 1997 [EP] European Pat. Off. .............. 97202567

[51] Int. Cl.$^6$ .................................................. C04B 35/64
[52] U.S. Cl. ......................... 264/603; 264/614; 264/618; 264/639; 264/669; 264/670; 156/89.12; 156/89.14; 29/25.42
[58] Field of Search ...................................... 264/614, 615, 264/618, 639, 669, 670; 156/89.14, 89.12; 29/25.42

[56] References Cited

U.S. PATENT DOCUMENTS

| | | | |
|---|---|---|---|
| 3,899,554 | 8/1975 | Kaiser et al. | 264/615 |
| 5,094,793 | 3/1992 | Schrenk et al. | 264/171 |
| 5,347,696 | 9/1994 | Willer et al. | 29/25.42 |
| 5,735,027 | 4/1998 | Hageman et al. | 29/25.42 |
| 5,758,398 | 6/1998 | Rijnbeek et al. | 29/25.42 |

FOREIGN PATENT DOCUMENTS

WO9701868  1/1997  WIPO .

OTHER PUBLICATIONS

"Novel Structures by Microlayer Coextrusion– Talc–Filled PP, PC/SAN, and HDPE/LLDPE", Chad D. Mueller, et al. Polymer Engineering and Science, Feb. 1997, vol. 37, No. 2, pp. 355–362.

*Primary Examiner*—James Derrington
*Attorney, Agent, or Firm*—Norman N. Spain

[57] ABSTRACT

A method of manufacturing a ceramic multilayer component, comprising electrically conductive and electrically insulating layers which are stacked in alternate arrangement in a multilayer structure, which method comprises the following steps:

providing three extrudable polymeric mixtures, each mixture comprising a binder and a particulate filler, whereby:
(a) a first mixture comprises a ceramic filler;
(b) a second mixture comprises a metallic filler and a first binder;
(c) the third mixture comprises a metallic filler and a second binder;

with the aid of an extrusion device having an extrusion channel which is provided with a layer-multiplication element, manufacturing an extruded multilayer stack comprising a plurality of the basic units abac, in which layers a,b,c correspond respectively to the first, second and third mixtures, the stack having two oppositely situated side walls along which part of each layer is exposed;

with the aid of a first solvent, dissolving away part of each layer b exposed along a first side wall of the multilayer stack, thereby creating open channels along the first side wall;

with the aid of a second solvent, dissolving away part of each layer c exposed along the second side wall of the multilayer stack, thereby creating open channels along the second side wall;

firing and sintering the multilayer stack;

providing electrical contact layers along both side walls, which contact layers contact the exposed layers in each side wall.

1 Claim, 4 Drawing Sheets

METHOD OF MANUFACTURING A MULTILAYER ELECTRONIC COMPONENT

BACKGROUND OF THE INVENTION

The invention relates to a method of manufacturing a ceramic multilayer component, comprising electrically conductive and electrically insulating layers which are stacked in alternate arrangement in a multilayer structure. Examples of such components include ceramic multilayer capacitors, actuators and transformers.

A method as stated above is known, for example, from European Patent Application EP-A 0 777 913. In the method therein described, a multilayer component is manufactured using sheets of green ceramic tape (each sheet being a dried slurry of ceramic particles in an organic binder). Each sheet has a thickness of the order of about 10 $\mu$m, and lateral dimensions of the order of 100×100 mm$^2$. Using a screen printing technique, each sheet is provided on one major surface with a matrix of planar metallic electrodes (comprising silver-palladium ink, for example, in a film having a thickness of the order of 1 $\mu$m). Many such sheets are arranged on top of one another in a multilayer stack, in such a manner that the electrodes are staggered back and forth in alternate layers. This stack is then compressed into a laminated sheet which is subsequently cut into strips, each strip comprising a linear array of electrode stacks, the cutting lines defining the strips being thus chosen that, along each long side wall of each strip, only alternate electrodes are exposed. After sintering these strips, their side walls can be provided with electrical contacts.

This known method has a number of disadvantages. For one, the layers of ceramic tape are relatively thick (because they must be self-supporting); as a result, because the total (cumulative) thickness of the finished component generally must fall within standard tolerances, the number of layers in the component is substantially limited (typically to a maximum of the order of about 150). In the case of a ceramic multilayer capacitor, this limitation restricts the achievable capacitance, which is quadratically proportional to the number of layers in the stack. In addition, the time required to manufacture a stack of n layers increases substantially linearly with n; increasing n by a factor p therefore requires the use of p times as many stacking machines, if a given manufacturing output is to be maintained. Another disadvantage is that, because relatively large areas of each ceramic sheet are not covered by electrodes, whereas other areas are covered, cumulative thickness-discrepancies arise as more and more layers are stacked, and such discrepancies can cause the stack to distort. Moreover, the extent to which the electrodes in alternate sheets are staggered back and forth is typically about 50% of the width of each electrode, which means that only a relatively small portion of each electrode contributes effective area to the finished component, leading to considerable waste.

SUMMARY OF THE INVENTION

It is an object of the invention to alleviate these problems. More particularly, it is an object of the invention to provide a method as stated in the opening paragraph, which method does not rely on the use of self-supporting layers of ceramic tape. Specifically, it is an object of the invention that this method should allow the manufacture of ceramic multilayer components having greatly increased numbers of constituent layers, each of greatly reduced thickness. Moreover, it is an object of the invention that this method should allow a relatively large portion of each electrode to contribute effective area to the finished component.

These and other objects are achieved according to the invention in a method as stated in the opening paragraph, characterized in that it comprises the following steps:

1) providing three extrudable polymeric mixtures, each mixture comprising a binder and a particulate filler, whereby:
   (a) a first mixture comprises a ceramic filler;
   (b) a second mixture comprises a metallic filler and a first binder;
   (c) the third mixture comprises a metallic filler and a second binder;
2) with the aid of an extrusion device having an extrusion channel which is provided with a layer-multiplication element, manufacturing an extruded multilayer stack comprising a plurality of the basic unit formed of layers abac, in which layers a,b,c correspond respectively to the first, second and third mixtures, the stack having two oppositely situated side walls along which part of each layer is exposed;
3) with the aid of a first solvent, dissolving away part of each layer b exposed along a first side wall of the multilayer stack, thereby creating open channels along the first side wall;
4) with the aid of a second solvent, dissolving away part of each layer c exposed along the second side wall of the multilayer stack, thereby creating open channels along the second side wall;
5) firing and sintering the multilayer stack;
6) providing electrical contact layers along both side walls, which contact layers contact the exposed layers in each side wall.

The method according to the invention has a number of distinct advantages. For one, the individual layers in the multilayer stack no longer have to be self-supporting, since the inventive method does not sequentially lay them one-at-a-time on top of one another, and since the ceramic layers no longer have to act as a substrate for the metallic (electrode) layers; consequently, the layers can have a much smaller thickness than is achievable with the known method. Furthermore, the time required to manufacture a stack of n layers is substantially independent of n, so that the invention offers a manufacturing process which is intrinsically faster than the prior art. Moreover, in steps (3) and (4), the channels created by dissolving away part of each metallic layer need not be very deep (only of the order of a few tens of microns, in fact), so that a very large portion (typically >95%) of each metallic layer b will overlap with each neighboring metallic layer c, resulting in a relatively large capacitance. In addition, because each layer created in step (2) extends across the full extent of the stack, there is no tendency towards thickness discrepancies (and attendant risk of deformation) in the finished stack.

The device employed in step (2) is occasionally referred to as a multi-flux extrusion device, and the principles of its operation are, for example, set forth in United States Patent U.S. Pat. No. 5,094,793 and in an article by C. D. Mueller et al. in *Polymer Engineering and Science* 37 (1997), pp 355–362. Basically, the procedure as employed in the current invention entails:

I. extruding a planar 4-layer structure abac from extrudable mixtures (a), (b), (a) and (c) provided at four respective extrusion inlets of the extrusion device;
II. by means of the layer-multiplication element, dividing the 4-layer structure into (at least) two lateral portions, which are re-arranged into a stack so as to form an 8-layer structure abacabac;
III. repeating step II as often as desired, whereby, on each occasion, a $2^m$-layer structure is divided into (at least) two lateral portions, which are re-arranged into a stack so as to form a $2^{m+1}$-layer structure (the value of the integer m at the first repeat is 3, and this value increases by 1 at each repeat).

Explicit attention is drawn to the following considerations:
A) The lateral dimensions of the multilayer resulting from the extrusion process in step (2) will be determined by the dimensions of the extrusion outlet (i.e. the exit of the extrusion channel) of the employed multi-flux device. In general, the width of the multilayer (parallel to the layers a,b,c and perpendicular to the extrusion direction) will be very much greater than the height of the multilayer (perpendicular to the layers a,b,c and to the extrusion direction), e.g. 20 mm 1 mm. Before proceeding with step (3), the extruded multilayer can be cut into a series of parallel strips extending along the extrusion direction; these strips should then have the width which is desired of the final product component, before they are each subjected to step (3). Of course, if the width of the extruded multilayer is already suitable, then subdivision into strips need not occur;
B) If so desired, the extrusion process in step (2) can be used to manufacture a number of "pre-stacks" containing relatively small numbers of layers, e.g. 16, 32 or 64 layers. Any number of such pre-stacks can then be stacked upon one another to form a thicker stack upon which step (3) can be performed.

The extrudable mixtures provided in step (1) of the inventive method may typically comprise a thermoplastic material such as polymethyl methacrylate (PMMA), polystyrene (PS) or low-density polyethene (LDPE), a plasticizer such as a dioctyl phthalate, paraffin wax or stearic acid, and a particulate filler such as (metallic) Ni powder or (ceramic) $BaTiO_3$ powder, for example; the particle size in the fillers may typically be of the order of about 1 $\mu$m, or less, and will determine the attainable minimum thickness of the layers a,b,c.

There are various selective solvents which can be used in steps (3) and (4); for example, PMMA and PS can be selectively dissolved in acetic acid and hot cyclohexane, respectively. Dissolution of the binder can be promoted by using a solvent in an ultrasonic bath, so as to vibrate released particulate filler out of the path of dissolution.

The firing procedure in step (5) causes removal of volatile material in the various layers of the multilayer stack. So as to prevent possible delamination or other damage to the layered structure, firing should be performed in a controlled manner, which will ultimately depend on the particular composition and thickness of the multilayer stack. In particular, the employed binders should be substances which do not undergo substantial exothermic decomposition at the firing temperature (typically of the order of about 700° C.), so as to avoid the risk of explosive decomposition. During heating, the mixture (a) in the multilayer structure will generally soften and fill out the dissolved channels resulting from steps (3) and (4); alternatively, if so desired, these channels can be filled with an insulating paste (e.g. the mixture (a) in step (I)) prior to firing, which paste then dries during step (5). After being fired, the multilayer stack is sintered (typically at a temperature of the order of about 1300° C.).

The components resulting from step (5) will most often have an elongated, strip-shaped form; such strips may, of course, be subdivided into smaller block-shaped components, by severing the strips at right angles to their length and at various points therealong.

The electrical contacts referred to in step (6) can be provided by several different methods, which are known per se in the art. For example, they can be sputter-deposited onto the side walls of the multilayer stack. Alternatively, parts of the stack which are not to be covered by contacts can be masked, and the contacts can then be provided using chemical vapor deposition. Contacts grown in either of these two manners can subsequently be thickened using a galvanic technique, for example. Another approach is to dip each side wall into a bath of metallic coating (e.g. molten solder or a metallic ink).

BRIEF DESCRIPTION OF THE DRAWING

In the drawing

Corresponding features in the various Figures are denoted by the same reference symbols.

DETAILED DESCRIPTION OF THE INVENTION

Embodiment 1

Figure 1:
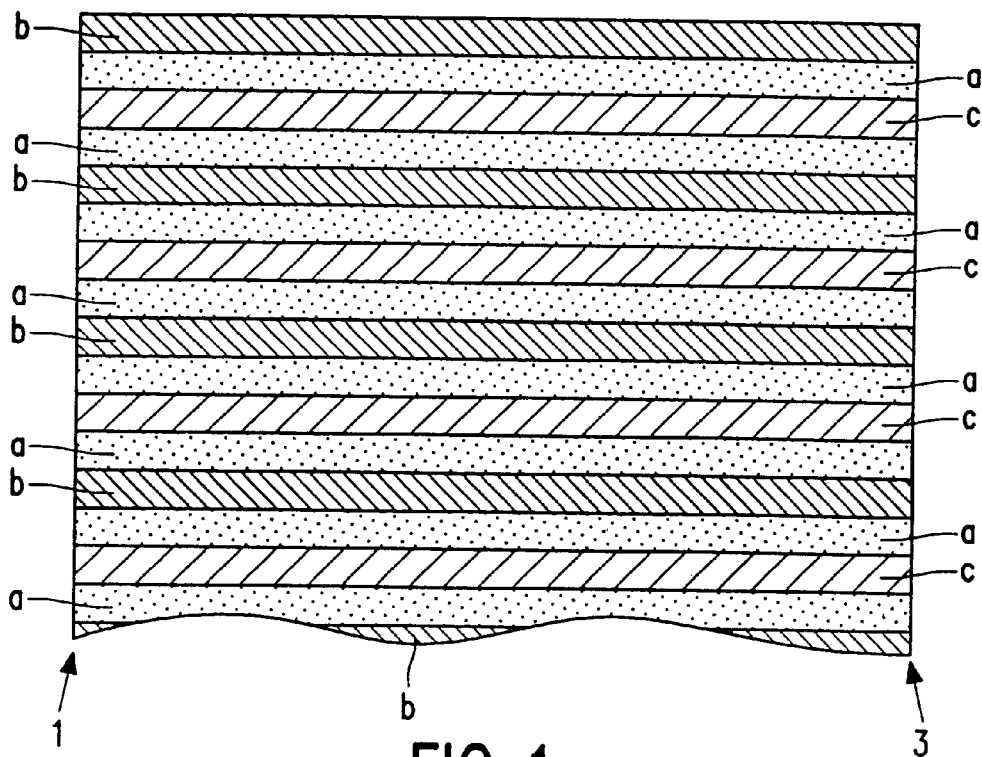
FIG. 1 is a cross-sectional view of part of a multilayer stack as produced by step (2) of the method according to the invention.

The invention will now be described in greater detail with references to the figures of the drawing and the following embodiments.

FIGS. 1–5 show various aspects of a particular embodiment of the method according to the invention.

FIG. 1 is a cross-sectional view of part of a multilayer stack as produced in step (2) of the inventive method. The stack comprises a repetitive plurality of the basic layer-units abac, in which layers a,b,c correspond respectively to:

a mixture of a particulate ceramic filler and a binder, e.g. 50 vol. % $BaTiO_3$ powder, 40 vol. % LDPE and 10 vol. % paraffin wax;

a mixture of a particulate metallic filler and a first binder, e.g. 50 vol. % Ni powder, 33 vol. % PMMA and 17 vol. % dioctyl phthalate;

a mixture of a particulate metallic filler and a second binder, e.g. 50 vol. % Ni powder, 35 vol. % PS and 15 vol. % dioctyl phthalate.

The stack has two oppositely situated side walls 1,3 along which part of each layer a,b,c is exposed. In this particular case, the stack comprises 128 layers (i.e. $2^7$). The total thickness of the stack (determined by the height of the extrusion outlet in step (2)) is 1 mm, so that the thickness of each layer a,b,c is approximately 7.8 $\mu$m. The width of the stack is 20 mm.

The stack was manufactured by extruding a multilayer at a temperature of 180° C. and a rate of 5 mm s$^{-1}$ from a multi-flux extrusion device. The extrusion channel of the employed device was fitted with a layer-multiplication element such as that described in Embodiments 2 and 3 below. The device's extrusion outlet had lateral dimensions of 20 mm×1 mm. Upon emergence from the extrusion outlet, the stack was sliced (by an array of blades) into 10 parallel strips, each of width 2 mm and height 1 mm.

Figure 2:
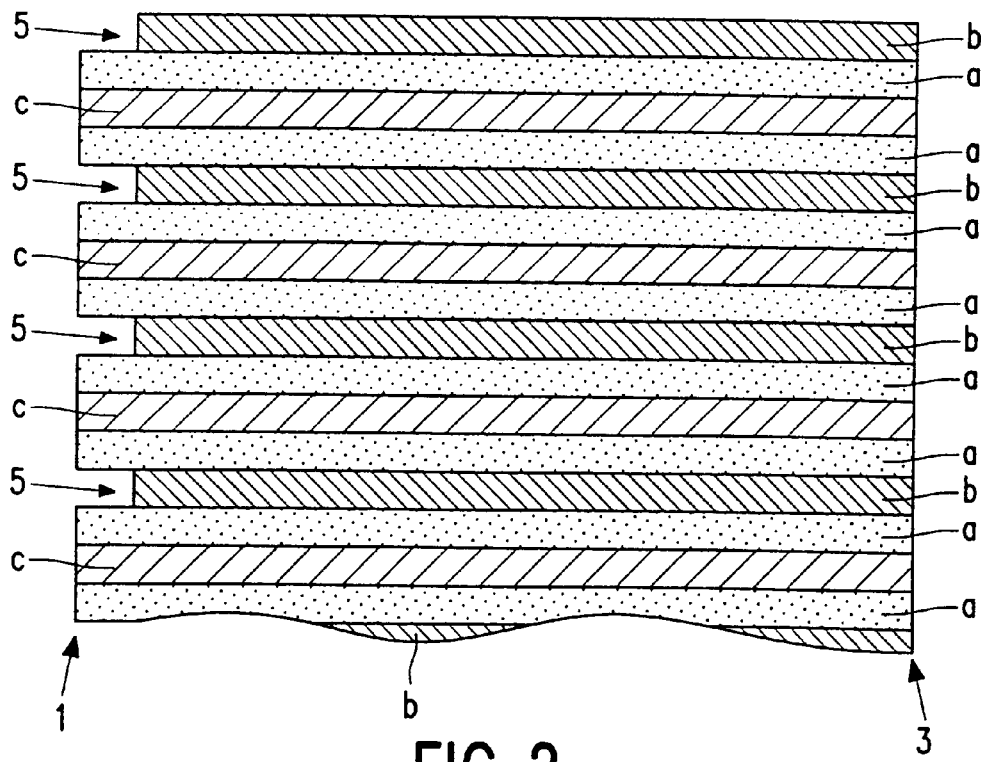
FIG. 2 shows the subject of FIG. 1, after the enaction thereupon of step (3) of the method according to the invention.

In FIG. 2, part of each metallic layer b exposed along the side wall 1 has been dissolved away, causing the formation of channels 5 extending perpendicular to the plane of the Figure (step (3) of the inventive method). This is achieved by dipping the side wall 1 into an ultrasonic bath containing acetic acid at room temperature. The channels 5 are etched to a depth of 10 $\mu$m (determined by the duration of the dip and the strength of the acid; dissolution rates of the order of 10–15 $\mu$m min.$^{-1}$ are typical). The layers a,c exposed along the side wall I are not affected, because their LDPE/PS binder does not dissolve in acetic acid.

Figure 3:
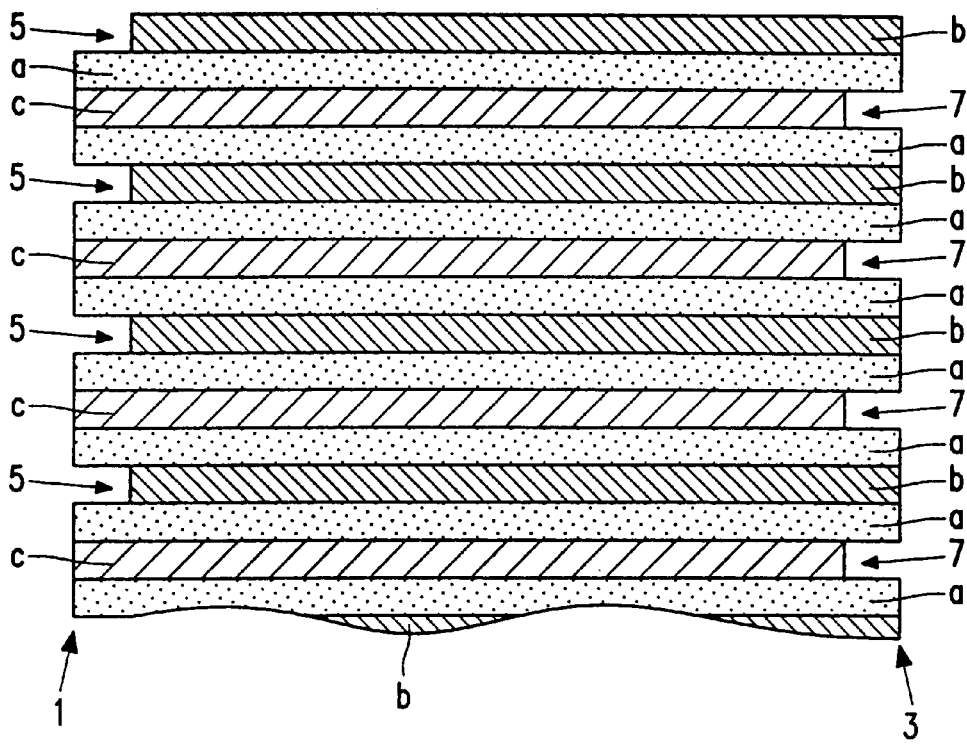
FIG. 3 depicts the subject of FIG. 2, subsequent to the enaction thereupon of step (4) of the method according to the invention.

In FIG. 3, part of each metallic layer c exposed along the side wall 3 has been dissolved away, causing the formation of channels 7 extending perpendicular to the plane of the Figure (step (4) of the inventive method). This is achieved by dipping the side wall 3 into an ultrasonic bath containing cyclohexane at a temperature of 45° C. The channels 7 are also etched to a depth of 10 $\mu$m. The layers a,b exposed along the side wall 3 are not affected, because their LDPE/PMMA binder does not dissolve in cyclohexane.

Figure 4:
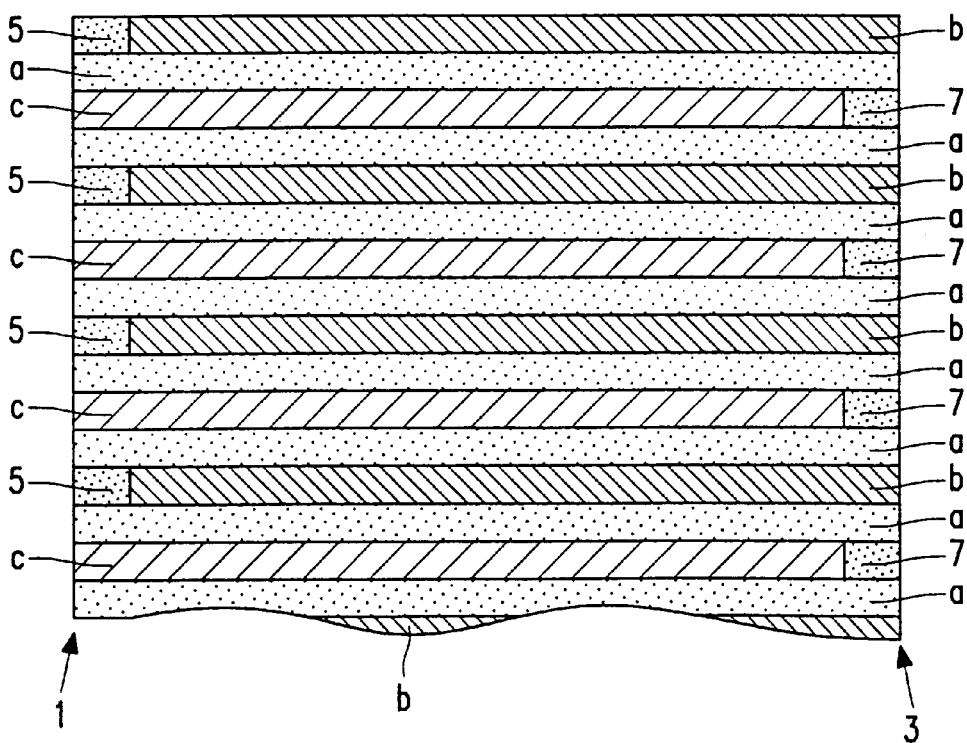
FIG. 4 shows the subject of FIG. 3, after performance of step (5) of the method according to the invention.

FIG. 4 shows the result of step (5) of the method according to the invention, whereby the structure resulting from step (4) has been fired and sintered. During heating, the mixture (a) softens, flows, and fills the channels 5,7.

Figure 5:
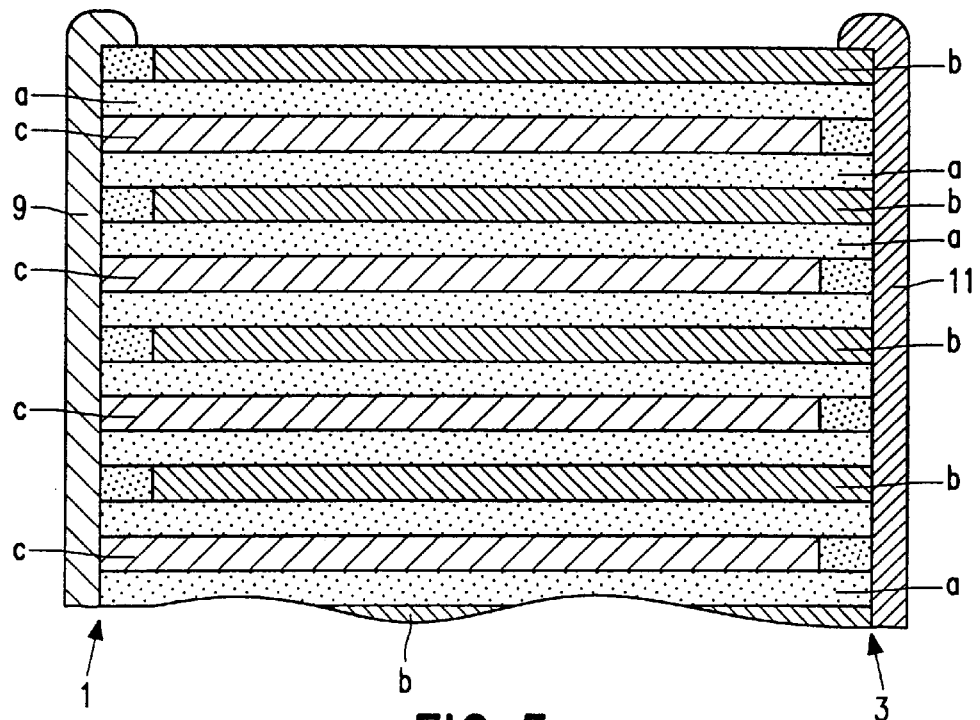
FIG. 5 shows the subject of FIG. 4, after enaction of step (6) of the method according to the invention.

In FIG. 5, electrical contact layers 9,11 have been provided along the respective side walls 1,3, in accordance with step (6) of the inventive method. The metallic layers c are only contacted by the contact layer 9, whereas the metallic layers b are only contacted by the contact layer 11; the resulting structure is thus a two-terminal capacitor with interleaved overlapping electrodes. The contact layers 9,11 may, for example, be provided by:

electrolessly depositing a thin metallic layer on each of the side walls 1,3, e.g. using sputter deposition or vapor deposition;
galvanically thickening the metallic layers thus deposited. Alternatively, one may simply dip each of the side walls 1,3 into a bath of molten solder or silver-palladium ink, for example.

To prevent the creation of a short circuit in step (6), the exposed metallic layer b along the top surface of the stack can be covered with a thin insulating film (e.g. a ceramic slurry) prior to step (5). Alternatively, subsequent to step (5), the said layer b can be covered with a thin layer of, for example, an insulating resin.

Embodiment 2

Figure 6:
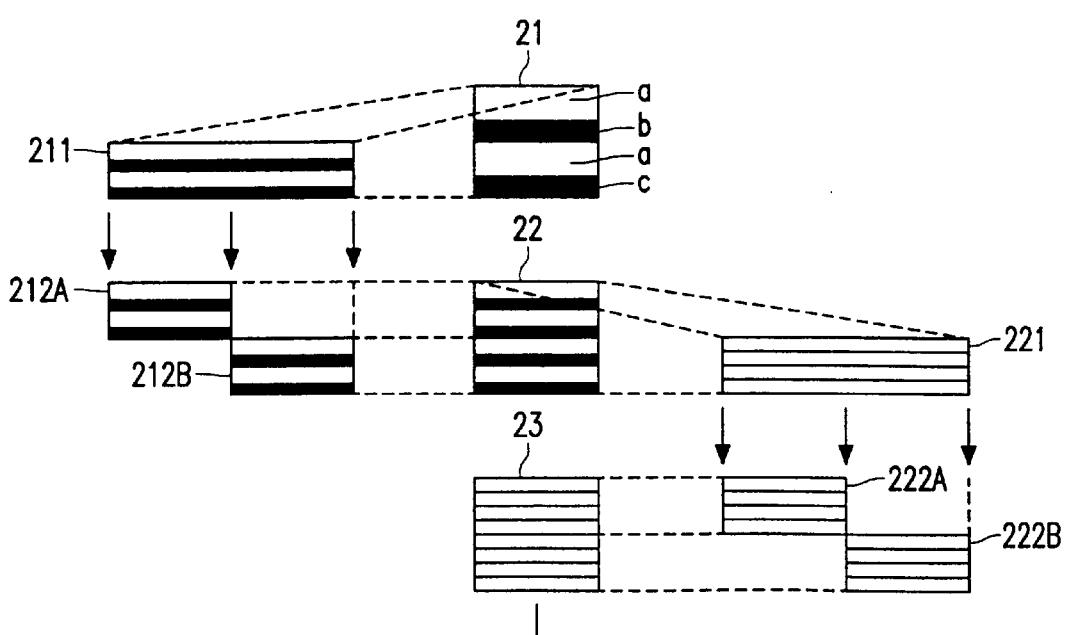
FIG. 6 illustrates the operating principle of a particular embodiment of a layer-multiplication element in the extrusion channel of a multi-flux extrusion device.

FIG. 6 demonstrates the principle of operation of a particular layer-multiplication element which can be employed in step (2) of the inventive method. Its action is as follows.

The starting product is a 4-layer stack 21 which comprises layers a,b,a,c;

The stack 21 is next flattened out to half its height and double its width, thus forming the stack 211;

The flattened stack 211 is then split into two lateral segments 212A,212B, which are subsequently arranged on top of one another so as to form the stack 22;

The stack 22 is next flattened out to half its height and double its width, thus forming the stack 221;

This flattened stack 221 is then split into two lateral segments 222A,222B, which are subsequently arranged on top of one another so as to form the stack 23;

This procedure can be repeated as often as desired, causing the number of layers in the stack to double on each occasion.

Embodiment 3

Figure 7:
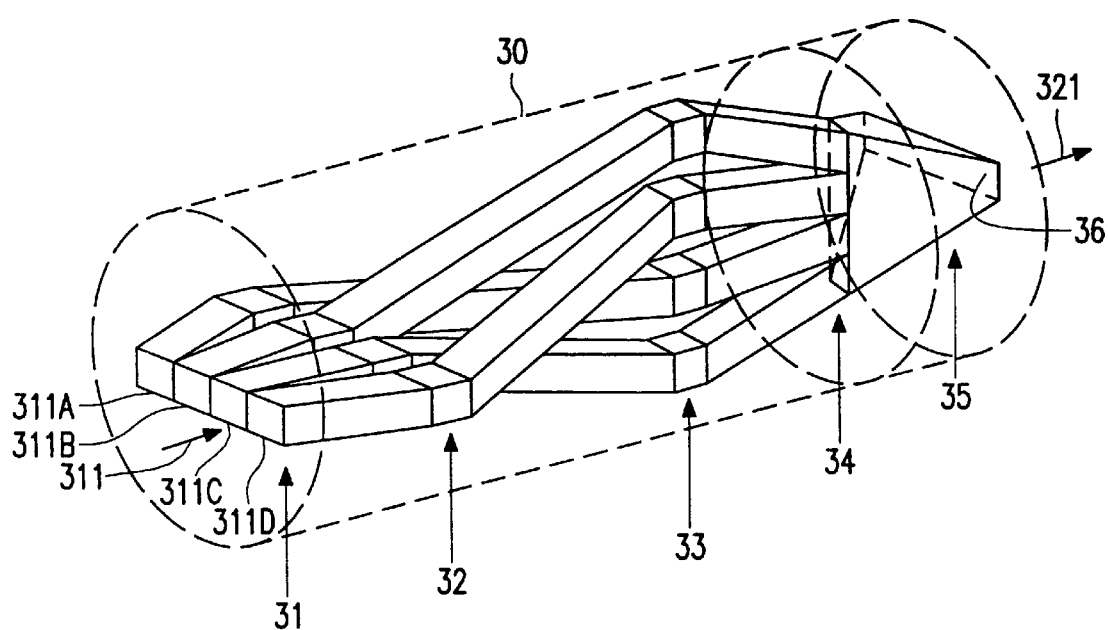
FIG. 7 gives a perspective view of part of another embodiment of a layer-multiplication element.

FIG. 7 demonstrates the mechanism of operation of another layer-multiplication element 30. Unlike the situation in FIG. 6, which refers to the operation of a doubling element, the scenario in FIG. 7 relates to an element 30 which has a quadrupling action. Its action is as follows:

An incident multilayer stack 311 is split at station 31 into four lateral segments 311A,311B,311C,311D;

Between stations 31 and 32, these segments are caused to mutually diverge;

Between stations 32 and 33, the segments are re-configured from a horizontal configuration into a vertical configuration;

Between stations 33 and 34, the segments are caused to mutually re-converge into a single stack;

Station 35 flattens and broadens out the re-converged stack—quartering its height and quadrupling its width—so that the stack 321 emerging from the orifice 36 has the same lateral dimensions as the incident stack 311;

This procedure can be repeated as often as desired, causing the number of layers in the stack to quadruple on each occasion.

We claim:

1. A method of manufacturing a ceramic multilayer component, comprising electrically conductive and electrically insulating layers which are stacked in alternate arrangement in a multilayer structure, characterized in that it comprises the following steps:

(1) providing three extrudable polymeric mixtures, each mixture comprising a binder and a particulate filler, whereby:
    (a) a first mixture comprises a ceramic filler;
    (b) a second mixture comprises a metallic filler and a first binder;
    (c) the third mixture comprises a metallic filler and a second binder;

(2) with the aid of an extrusion device having an extrusion channel which is provided with a layer-multiplication element, manufacturing an extruded multilayer stack comprising a plurality of a basic unit of layers abac, in which layers a,b,c correspond respectively to the first, second and third mixtures, the stack having two oppositely situated side walls along which part of each layer is exposed;

(3) with the aid of a first solvent, dissolving away part of each layer b exposed along a first side wall of the multilayer stack, thereby creating open channels along the first side wall;

(4) with the aid of a second solvent, dissolving away part of each layer c exposed along the second side wall of the multilayer stack, thereby creating open channels along the second side wall;

(5) firing and sintering the multilayer stack;

(6) providing electrical contact layers along both side walls, which contact layers contact the exposed layers in each side wall.

* * * * *